(12) United States Patent
Chang

(10) Patent No.: US 6,239,358 B1
(45) Date of Patent: May 29, 2001

(54) I/O SHIELD FOR ELECTRONIC ASSEMBLIES

(75) Inventor: Jen-Jou Chang, Yung-Ho (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/309,523

(22) Filed: May 11, 1999

(30) Foreign Application Priority Data

May 14, 1998 (TW) .................................. 87207440

(51) Int. Cl.[7] ..................................... H05K 9/00
(52) U.S. Cl. ................ 174/35 R; 361/683; 361/686; 361/816
(58) Field of Search ................ 174/35 R, 35 GC; 361/816, 818, 686, 683

(56) References Cited

U.S. PATENT DOCUMENTS 5,684,271 * 11/1997 Scholder et al. ................ 174/35 R
6,023,415 * 2/2000 Mayer et al. .................... 361/816

* cited by examiner

Primary Examiner—Dean A. Reichard
Assistant Examiner—Hung V Ngo
(74) Attorney, Agent, or Firm—We Te Chung

(57) ABSTRACT

An I/O shield for electronic assemblies includes a shielding plate with a variety of receiving slots disposed therein and a pair of side walls extending from opposite edges thereof. The shielding plate is guided into a corresponding opening defined in a chassis of the electronic assembly by the side walls. The slots are engaged with corresponding connectors mounted to an inner main board of the electronic assembly and retain the connectors in position. A plurality of spaced spring contacts is formed on the side walls, each including two base portions integral with a surface of the side wall and an intermediate projecting portion having a planar section parallel to the side wall. Since the two base portions of each spring contact are integral with the side wall, placement and removal of the shield are thereby facilitated. Furthermore, the area of engagement between each spring contact and a peripheral flange of the opening of the chassis is increased due to the planar portion of the spring contact thereby providing enhanced shielding capabilities.

12 Claims, 6 Drawing Sheets

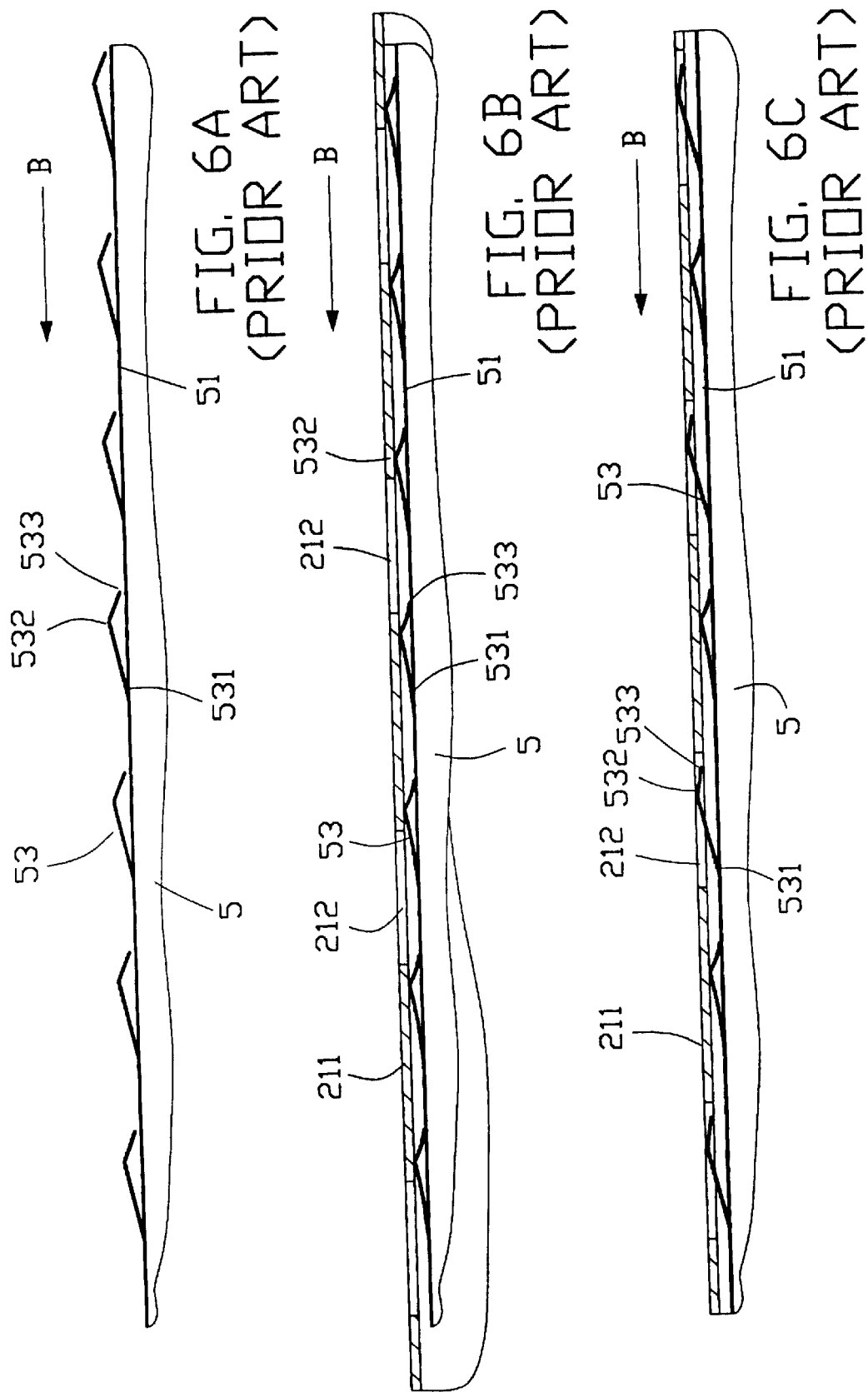

I/O SHIELD FOR ELECTRONIC ASSEMBLIES

BACKGROUND OF THE INVENTION

The present invention relates to an I/O shield engaged with an opening disposed in a chassis of an electronic assembly for providing connection access for connectors mounted to a main board, and more particularly to an I/O shield having spring contacts for facilitating placement and removal of the I/O shield and providing enhanced shielding capabilities.

DESCRIPTION OF PRIOR ART

As the rapid development of electronic assemblies progresses, expansion requirements have arisen for providing the electronic assemblies with additional functions. Thus, it is necessary to add new components to circuit boards installed within the electronic assemblies, or to rearrange the inner space of the electronic assemblies for accommodating more components. In most cases, a main board is directly attached to an enclosure of the electronic assembly. In this way, assembly becomes time consuming. Furthermore, the enclosure must be removed and reinstalled during maintenance, expansion, and replacement of the inner main board.

To overcome the deficiency mentioned above, an I/O shield for an electronic assembly, such as a computer device, is introduced. Referring to FIG. 5, an opening 21 is defined in a chassis 20 of an electronic assembly 2 for receiving an I/O shield 5. The shield 5 comprises a pair of side walls 51 respectively outwardly extending from opposite edges thereof in a direction away from an interior of the electronic assembly 2. The shield 5 is mounted to the opening 21 of the chassis 20 from the direction as indicated by an arrow "B" with the side walls 51 abutting against a peripheral flange 211 of the opening 21. A plurality of notches 212 is defined in the peripheral flange 211 of the opening 21. A plurality of slots 52 having different shapes is disposed in the shield 5 for providing corresponding connectors (not shown) mounted to a main board (not shown) installed within the electronic assembly 2 with connection access for mating with corresponding external connectors and retaining the connectors in position. A plurality of stamped and formed protrusions 53 having an inverse V-shape is formed on the side walls 51.

Also referring to FIGS. 6A and 6B, each protrusion 53 comprises a base portion 531 integral with the side wall 51, a free end 533 extending beyond the surface of the side wall 51 and a bend 532 formed between the base portion 531 and the free end 533. The tip of the bend 532 of the protrusion 53 is located nearer to the free end 533 than to the base portion 531. The bend 532 and the base portion 531 are elastically deformed when the shield 5 is mounted to the opening 21 of the chassis 20 and the protrusions 53 are pressed by the peripheral flange 211 of the opening 21.

Also referring to FIG. 6C, after the shield 5 is mounted to the chassis opening 21, the elastically deformed free ends 533 of some of the protrusions 53 return to their original position into the notches 212. When moving the shield 5 from the opening 21 of the chassis 20 in a reverse direction relative to the direction of arrow "B", the free ends 533 of some of the protrusions 53 hook on the flange 211 defining the notches 212 thereby hindering removal of the shield 5.

SUMMARY OF THE INVENTION

Accordingly, one object of the present invention is to provide an I/O shield which facilitates placement and removal of the shield from a chassis of the electronic assembly thereby making the replacement of components and the assembly of the electronic assembly more convenient.

Another object of the present invention is to provide an I/O shield for increasing an area of engagement between the chassis of the electronic assembly and the shield thereby enhancing shielding capabilities.

A further object of the present invention is to provide an I/O shield comprising separate parts exhibiting high resiliency and intensity.

In order to achieve the objects set forth, an I/O shield for an electronic assembly in accordance with preferred embodiments of the present invention comprises a shielding plate with a variety of receiving slots disposed therein and a pair of side walls extending from opposite edges thereof. The shielding plate is guided into a corresponding opening defined in a chassis of the electronic assembly by the side walls. The slots are engaged with corresponding connectors mounted to an inner main board of the electronic assembly and retain the connectors in position. A plurality of spaced spring contacts is formed on the side walls, each comprising two base portions integral with a surface of the side wall and an intermediate projecting portion having a planar section parallel to the side wall. Since the two base portions of each spring contact are integral with the side wall, placement and removal of the shield are thereby facilitated. Furthermore, the area of engagement between each spring contact and a peripheral flange of the opening of the chassis is increased due to the planar portion of the spring contact thereby providing enhanced shielding capabilities.

Other objects, advantages and novel features of the invention will become more apparent from the following detailed description when taken in conjunction with the accompanying drawings.

BRIEF DESCRIPTION OF THE DRAWINGS

FIGS. 6A through 6C illustrate the sequential insertion of the conventional I/O shield into the chassis of the electronic assembly.

DETAILED DESCRIPTION OF THE EMBODIMENTS

Figure 1:
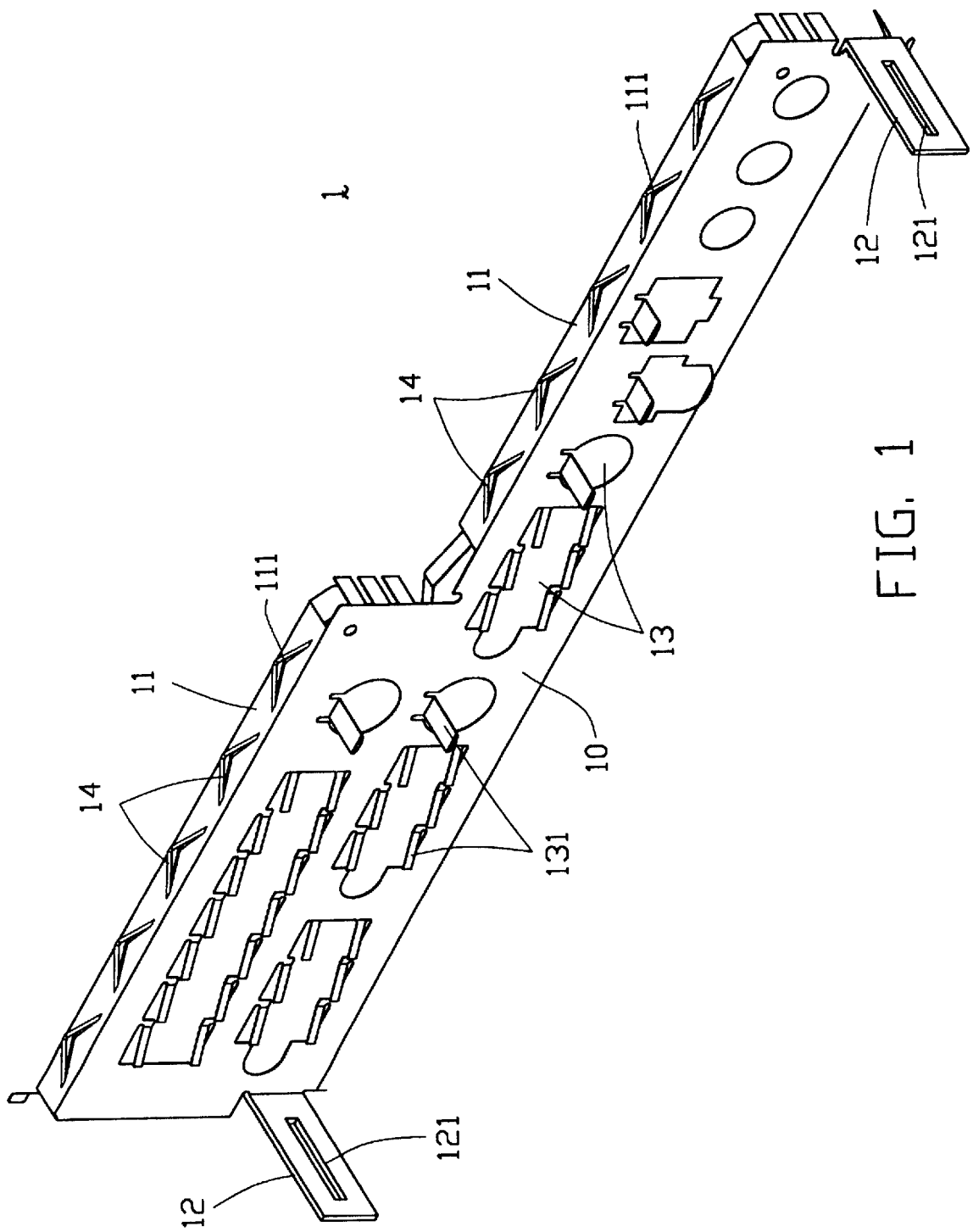
FIG. 1 is a perspective view of an I/O shield in accordance with a first embodiment of the present invention.
Figure 2:
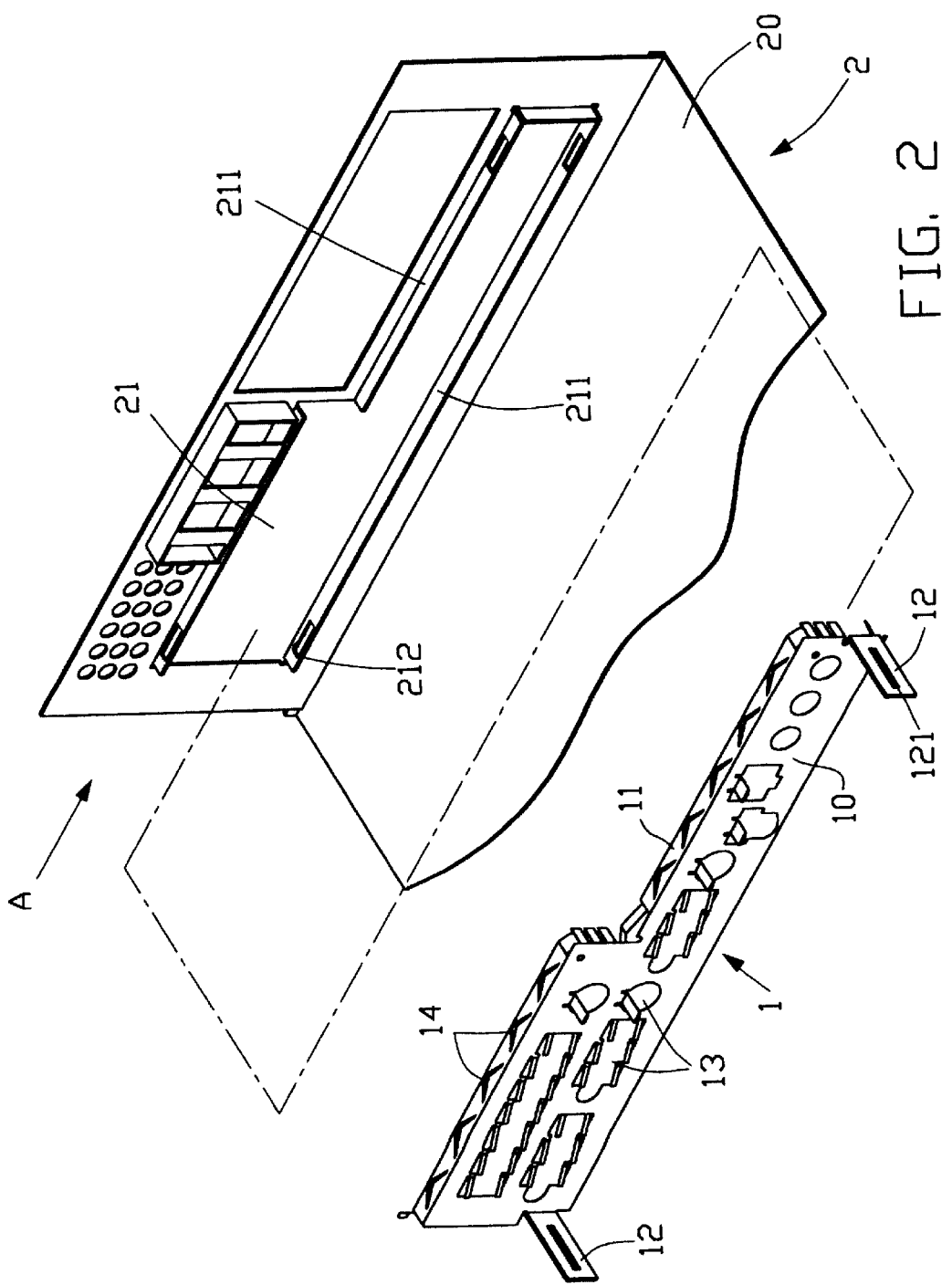
FIG. 2 is a perspective view of the shield of FIG. 1 and a chassis of an electronic assembly.

Referring to FIGS. 1 and 2, an I/O shield 1 in accordance with a first embodiment of the present invention comprises a shielding plate 10. The shield 10 is used to be mounted to an opening 21 of a chassis 20 of an electronic assembly 2. The shield 1 has an outer shape corresponding generally to the opening 21. A pair of side walls 11 respectively outwardly extends from opposite longitudinal edges of the shielding plate 10 relative to the chassis 20 for guiding the plate 10 into the chassis opening 21. A pair of latch members 12 perpendicularly extends from opposite lateral edges of the shielding plate 10 each defining an aperture 121 therein for engaging with a corresponding main board (not shown) installed within the electronic assembly 2. A variety of receiving slots 13 is disposed in the plate 10 for the extension of mating portions of corresponding connectors (not shown) mounted to the main board. At least one tab 131 is stamped and formed on the inner surface of each slot 13 for retaining the corresponding connector in position and forming grounding passages.

Figure 3B:
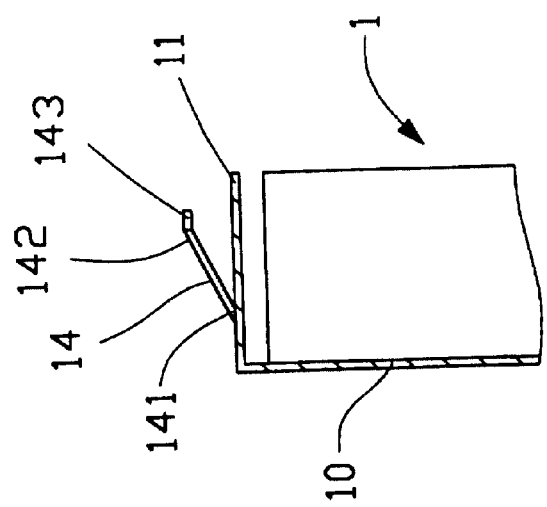
FIG. 3B is a side view of FIG. 3A.
Figure 3A:
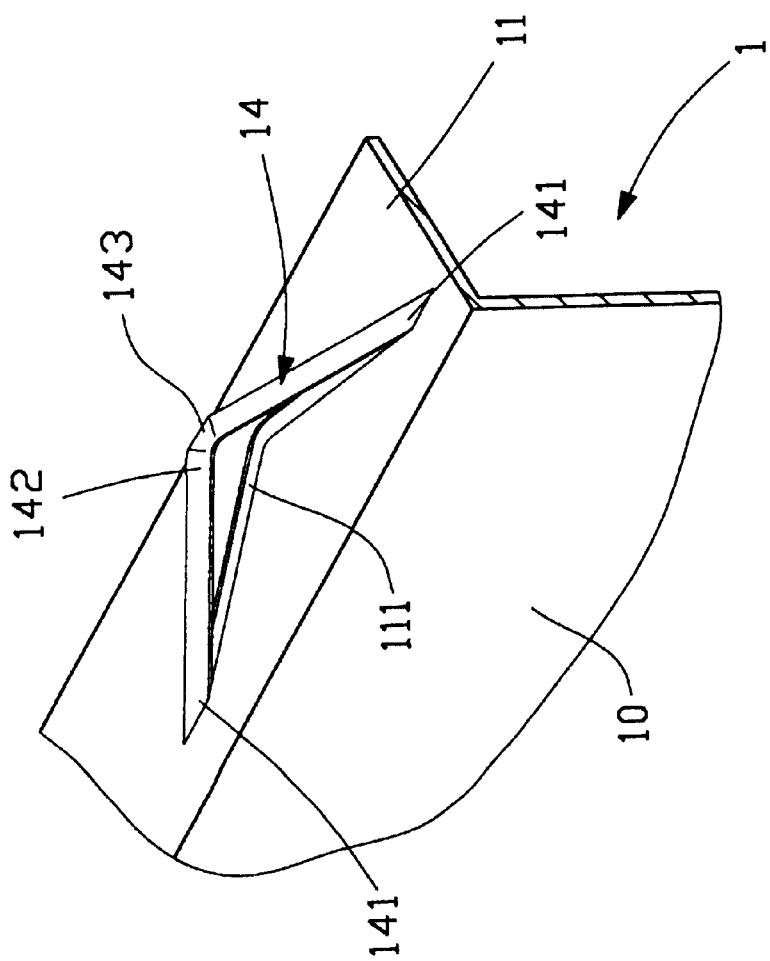
FIG. 3A is an enlarged, fragmentary view of the I/O shield showing a spring contact.

Also referring to FIGS. 3A and 3B, a plurality of spaced arcuate spring contacts 14 is formed on the side walls 11 by stamping and bending whereby a corresponding hole 111 is defined in the side walls 11. Each spring contact 14 comprises two base portions 141 integral with the corresponding side wall 11, and a projecting portion 142 therebetween. A line (not labeled) extends through the two base portions 141 and is approximately parallel to the direction of arrow "A". A planar section 143 is formed on a top of the projecting portion 142 to be parallel to the surface of the side wall 11.

Referring back to FIG. 2, the shield 1 is mounted to the opening 21 of the chassis 20 of the electronic assembly 2 in the direction of arrow "A". Thus, the main board engaged with the plate 1 is installed within the electronic assembly 2. During insertion, the plate 1 is guided to slide along a peripheral flange 211 of the chassis 20 beside the opening 21 by sliding the side walls 11 along the flange 211. During the mounting of the shield 1 to the opening 21, the spring contacts 14 are depressed by the peripheral flange 211 of the chassis opening 21. The planar sections 143 of the spring contacts 14 abut against the peripheral flange 211 of the chassis opening 21 to increase the area of engagement between each spring contact 14 and the peripheral flange 211 thereby providing enhanced shielding capabilities.

During the mounting of the shield 1 to the opening 21 of the chassis 20, elastic deformation of the base portions 141 of each depressed spring contact 14 causes the projecting portion 142 to lower. When the shield 1 reaches its final mounting position, the spring contacts 14 move into corresponding notches 212 defined in the peripheral flange 211, in which the base portions 141 of the corresponding spring contacts 14 elastically recover due to release of pressure thereby causing the projecting portions 142 to project upward into the notches 212. In the present invention, since each spring contact 14 is integral with the corresponding side wall 11 by the base portion 141 at two lateral sides of the spring contact 14, during a movement of the shield 1 away from the chassis 20 opposite the direction "A", the spring contact 14 will not have any portion hook on the flange 211 defining the notches 212. Thus, the shield 1 can be easily mounted/dismounted to/from the chassis 20 to facilitate a replacement or repair of electronic components on the main board connecting with the shield 1.

Figure 4:
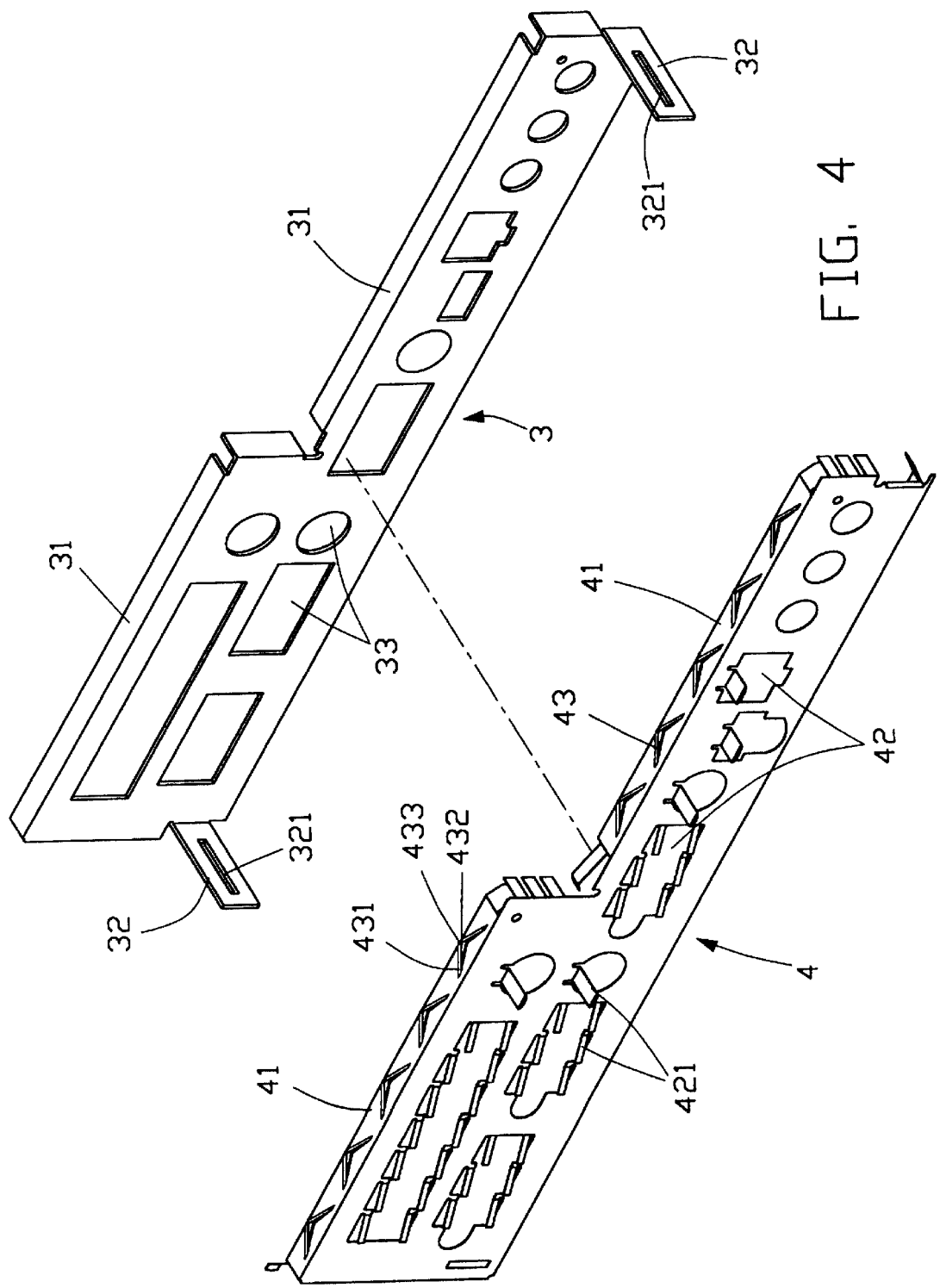
FIG. 4 is an I/O shield comprising a reinforcing plate and a shield in accordance with a second embodiment of the present invention.
Figure 5:
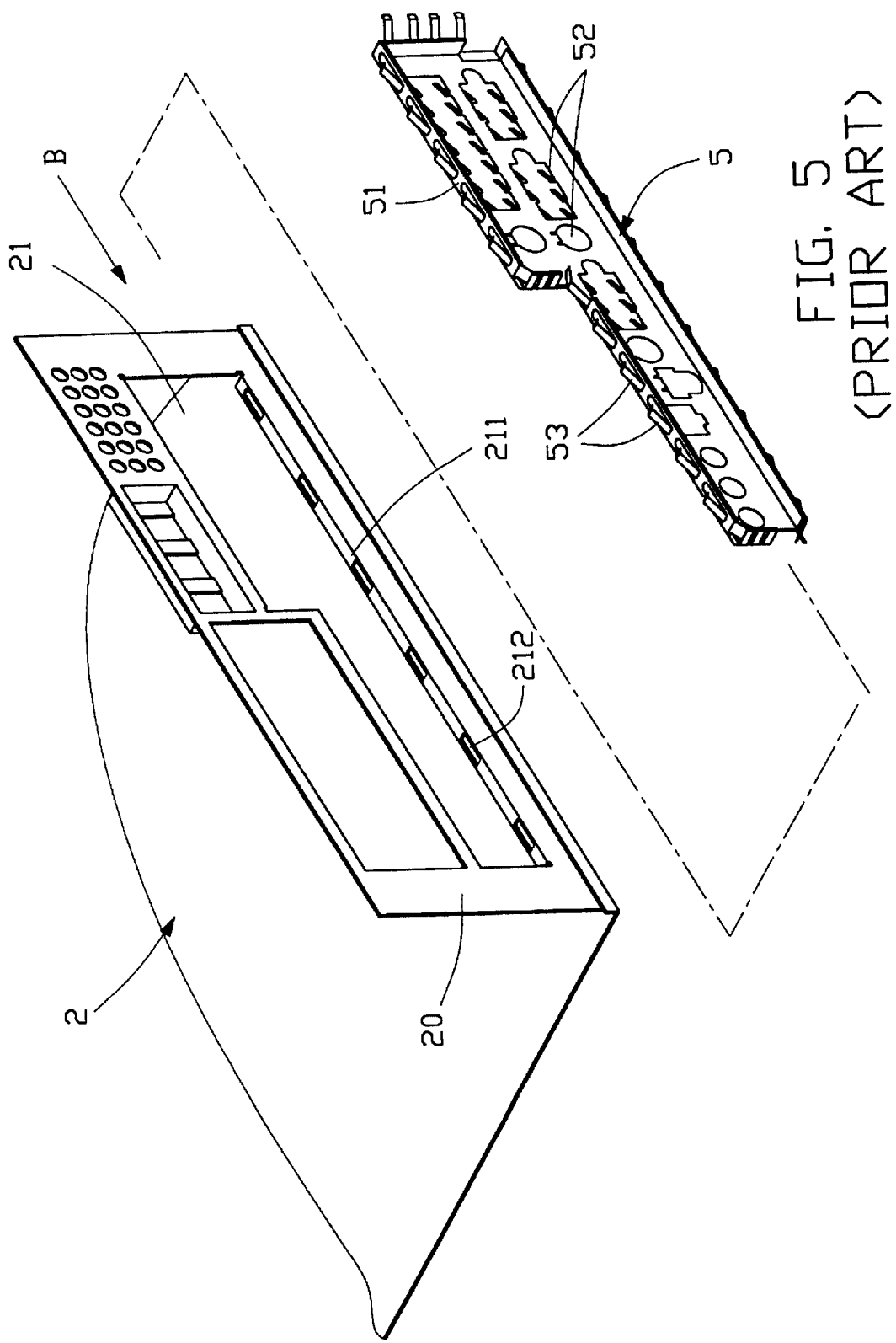
FIG. 5 is a perspective view of a conventional I/O shield and a chassis of an electronic assembly.

Referring to FIG. 4, an I/O shield in accordance with a second embodiment of the present invention comprises a reinforcing plate 3 and a shield 4 attached together. The shield 4 has a larger flexibility than the reinforcing plate 3. Each of the reinforcing plate 3 and shield 4 has an out shape corresponding generally to the opening 21 of the electronic assembly 2. The reinforcing plate 3 is made from rigid sheet metal, and the shield 4 is made from flexible sheet metal. The reinforcing plate 3 comprises a pair of extensions 31 outwardly extending from opposite longitudinal edges thereof relative to the chassis 20 of the electronic assembly 2. A pair of latch members 32 perpendicularly extends from opposite lateral edges of the reinforcing plate 3. Each latch member 32 defines an aperture 321 therein for engaging with a corresponding main board (not shown) installed within the electronic assembly 2. A plurality of receiving slots 33 having different shapes is disposed in the reinforcing plate 3 for the extension of mating portions of corresponding connectors (not shown) mounted to the main board.

The shield 4 for enclosing the reinforcing plate 3 comprises a pair of side walls 41 similar to the extensions 31 of the reinforcing plate 3 with a plurality of stamped and bent spring contacts 43 integrally formed thereon. The spring contacts 43 are adapted for guiding the two attached plates 3, 4 into the chassis opening 21. Each spring contact 43 comprises two base portions 431 integral with the side wall 41, an intermediate projecting portion 432 and a planar section 433 formed on a top of the projecting portion 432. A line (not labeled) extends through the two base portions 431 and is approximately parallel to the direction of arrow "A" (FIG. 2). A plurality of receiving slots 42 is disposed in the shield 4 corresponding to the slots 33 of the reinforcing plate 3. Each receiving slot 42 has at least one resilient tab 421 formed on an inner surface thereof for abutting against a corresponding connector thereby providing grounding capabilities.

It can be understood that in the invention because the spring contact 14 is directly stamped from the side wall 11 with its two ends integrally formed therewith, and later bent spaced from the side wall 11, it is required to have such a spring contact 14 or the corresponding opening 111 in the side wall 11 extend in two dimensions, i.e., along both axes X and Y in the plane of the side wall 11. Additionally, the spring contact 14 should provide a slope in both back-to-forth directions along the insertion direction, and thus the spring contact 14 should extend at an acute angle with regard to the back-and-forth directions of the insertion direction of the shield. Therefore, the opening 111 of the side wall 11 is formed with two sections angled with each other and converged at an apex where the planar section 143 of the contact 14 is derived from. The configuration of the spring contact 14 and the corresponding opening 111 are apparently different from the conventional structure which is generally to have a cantilever type spring contact stamped from a linear opening in the side wall.

It is to be understood, however, that even though numerous characteristics of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. An I/O shield mounted to an opening defined in a chassis of an electronic assembly for shielding a main board installed within the electronic assembly and providing connection access for the main board, the I/O shield comprising:

a shielding plate comprising a pair of side walls respectively integrally extending from opposite edges thereof; and a plurality of spring contacts stamped directly from the plane of the side walls, thereby a plurality of openings formed within said side walls, each of said openings including two sections angled with and converged to each other, each spring contact comprising two base portions integral with one of the side walls and an intermediate portion between the two base portions, a line extending through the two base portions being approximately parallel to an insertion direction of the shielding plate into the opening of the electronic assembly, and the intermediate portion projecting sideward to be moveable about the line.

2. The I/O shield as described in claim 1, wherein the intermediate portion of the spring contact comprises a planar section.

3. The I/O shield as described in claim 2, wherein the planar section of the spring contact is parallel to the surface of the side wall.

4. The I/O shield as described in claim 1, wherein the shielding plate comprises a reinforcing plate and a shield enclosing the reinforcing plate.

5. The I/O shield as described in claim 4, wherein the reinforcing plate is made from a relatively thick, rigid metal sheet, and the shield is made from a relatively thin, flexible metal sheet.

6. The I/O shield as described in claim 1, wherein the plurality of spring contacts are integrally formed on the shield.

7. The I/O shield as described in claim 1, wherein the spring contacts are formed by stamping and bending to leave through holes in the side walls.

8. The I/O shield as described in claim 1, wherein the side walls extend from the shielding plate in a direction away from an interior of the electronic assembly.

9. The I/O shield as described in claim 1, wherein the shielding plate comprises a pair of latch members extending inward from opposite lateral edges thereof relative to the chassis of the electronic assembly, each latch member comprising an aperture for engaging with the main board installed within the electronic assembly.

10. A structure comprising:

a first device including a plane; and a spring contact stamped directly from the plane with an opening remaining therein, a contour of said opening being similar to that of said spring contact, said spring contact including two base portions integrally formed with the plane and an intermediate portion connected therebetween, said intermediate portion being spaced from the plane in a distance; wherein the spring contact is able to freely move back and forth in an opening of a second device along an insertion direction of the first device with regard to the second device when said first device and said second device are releasably fastened to each other.

11. The structure as described in claim 10, wherein said opening extend in two dimensions in said plane.

12. The structure as described in claim 10, wherein said opening includes two sections angled with and converged to each other.

\* \* \* \* \*